United States Patent [19]

Schaeffer

[11] 4,399,354
[45] Aug. 16, 1983

[54] DIGITAL RATE MONITOR

[75] Inventor: Daniel Schaeffer, Chicago, Ill.

[73] Assignee: Vorne Industries, Inc., Chicago, Ill.

[21] Appl. No.: 131,249

[22] Filed: Mar. 17, 1980

[51] Int. Cl.³ .............................................. H03K 21/30
[52] U.S. Cl. ..................................... 377/26; 364/565;
377/20; 377/39
[58] Field of Search ............ 235/92 TF, 92 T, 92 FQ,
235/92 CP, 92 DP, 92 FP; 364/565, 569, 707;
324/166, 178

[56] References Cited

U.S. PATENT DOCUMENTS

| | | | |
|---|---|---|---|
| 3,917,927 | 11/1975 | Minton | 235/92 TF |
| 4,066,875 | 1/1978 | Ollington et al. | 235/92 TF |
| 4,093,850 | 6/1978 | Karnowski et al. | 235/92 TF |
| 4,184,203 | 1/1980 | Skarvada | 364/565 |
| 4,274,142 | 6/1981 | Furuhashi et al. | 324/166 |

Primary Examiner—Joseph M. Thesz
Attorney, Agent, or Firm—Emrich, Lee, Brown & Hill

[57] ABSTRACT

A digital rate monitor including a microprocessor operating under program control to receive and process event pulses to calculate the rate of the event pulses, and display the calculated rate. The rate is calculated by accumulating a batch of pulses and measuring the time it takes to accumulate such number of pulses. The batch size for a given calculation is a function of the event pulse rate, and a different batch size is automatically selected if the event pulse rate increases or decreases within a certain range. The rate is calculated once per second by averaging sixteen pulses for high speed inputs, four pulses for intermediate rates, and using a single pulse for low speed inputs.

10 Claims, 4 Drawing Figures

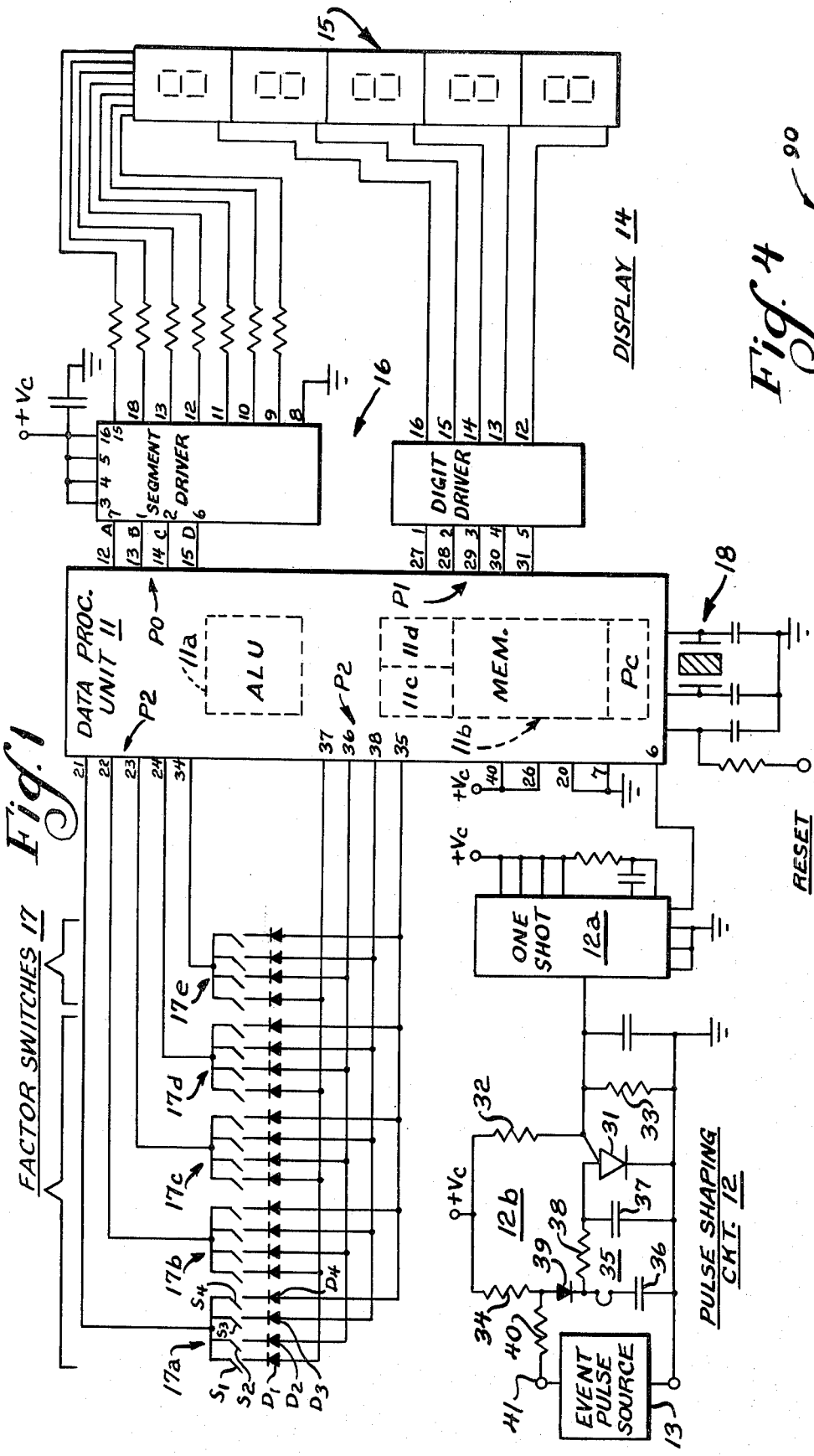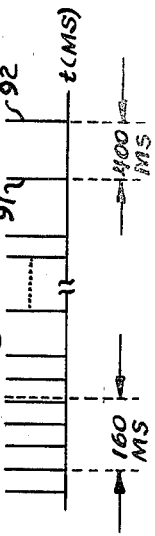

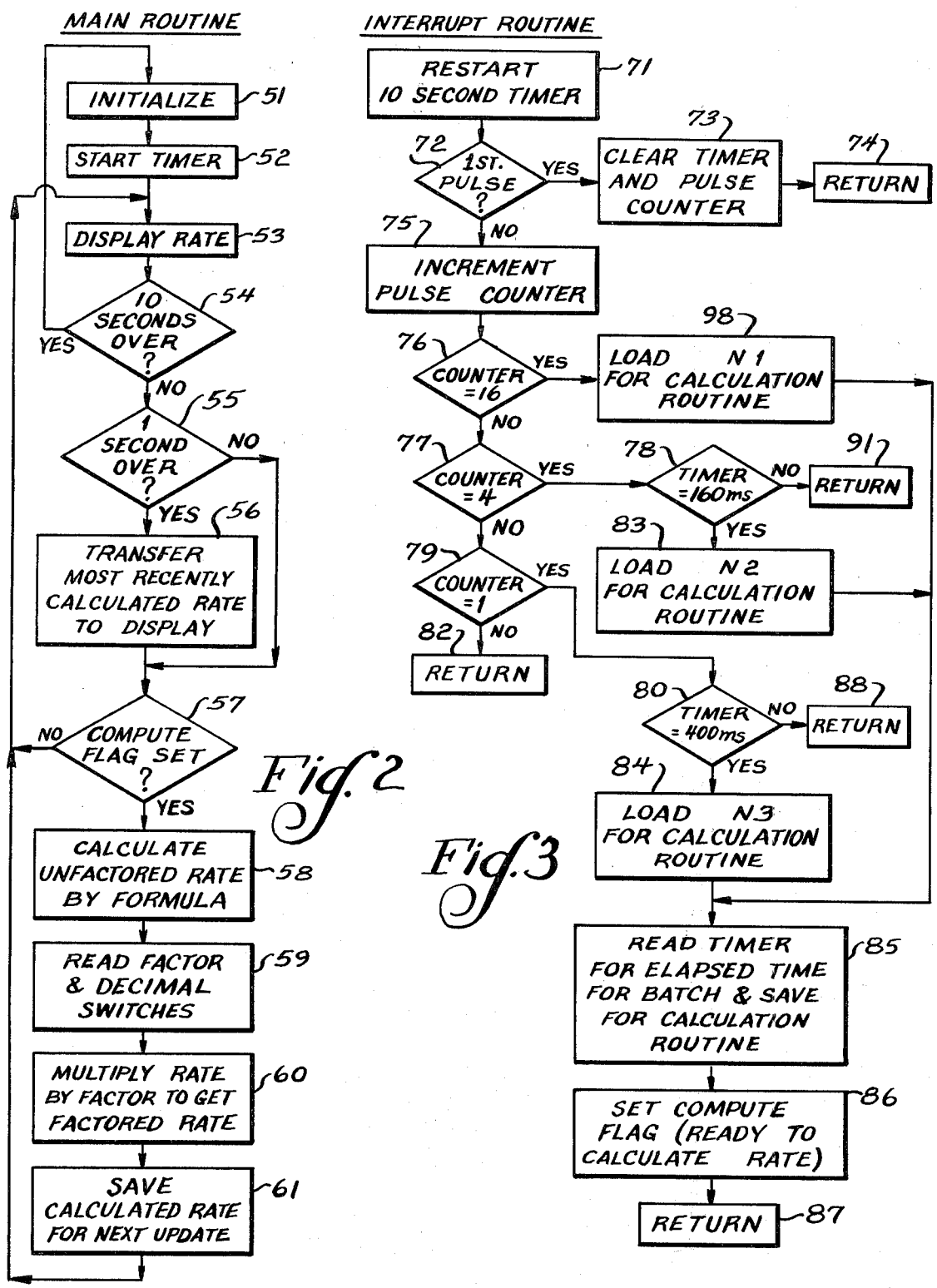

DIGITAL RATE MONITOR

BACKGROUND OF THE INVENTION

Field of the Invention. This invention relates to rate monitors, and more particularly to an auto-ranging digital rate monitor in which a number of event pulses accumulated, the number preselected as a function of the rate of the event pulses, and the time elapsed in accumulating the pulses are used in calculating the rate of occurrence of the event pulses.

Description of the Prior Art. There are basically two types of rate monitors, one of which operates on the gate-time principle and the other of which operates on the principle of measuring the time interval between consecutive event pulses. In the first approach, event pulses are gated to a pulse counter during a time interval of a preselected duration. The number of pulses counted and the fixed time are used in calculating the rate of the pulses. However, since the time is fixed, this type of rate monitor does not provide rapid response at low input rates without producing a large inaccuracy.

In the other type of rate monitor, a first event pulse of a series is used to enable a gate which passes timing pulses at known frequency to a pulse counter. The next event disables the gate so that the number of timing pulses counted corresponds to the elapsed time between the two event pulses. Most rate monitors of this type suffer the disadvantage of being able to measure every other period to allow time for the rate calculation. An improved rate monitor of this type, disclosed in U.S. Pat. No. 4,093,850 allows for measurement of the time interval between every pair of consecutive event pulses by performing measurement of a given period and rate calculation for the previous period concurrently.

In both types of units, an added degree of resolution can be obtained through the use of range select switches which are manually operable to increase, or decrease, the time interval during which event pulses are counted, or to increase, or decrease, the rate of the elapsed time pulse generator. However, the need for manual range selection requires that the user select the range which affords the most accurate reading, and that the user, in the same instances change the selecter range, particularly in applications where the event pulse rate varies over a wide range.

SUMMARY OF THE INVENTION

The present invention provides an autoranging arrangement for a digital rate monitor which continuously monitors the rate of event pulses supplied to the unit and provides a digital display of the rate of the input pulses. The rate monitor, operates on a pulse sampling basis and in accordance with the invention automatically samples a larger or smaller number of pulses in correspondence with an increase or decrease in the rate of the event pulses. The rate monitor is a microprocessor-based system which operates under program control to receive and process event pulses to calculate the rate of the event pulses, and to display the rate calculated on a display unit.

The rate monitor receives event pulses, averages the rate of input each second and displays the rate calculated. In accordance with the invention, the rate of the event pulses is calculated by accumulating a given number or batch of pulses and measuring the time it takes to accumulate such number of pulses. The number of pulses, or batch size for a given calculation is a function of the rate at which event pulses are being received, and a different batch size is automatically selected if the rate of the event pulses increases or decreases within a certain range. The batch size may be one, four or sixteen, for example, and thus a batch of pulses may include either one, four or sixteen pulses. The number of pulses sampled, that is, the batch size, is taken as large as possible while permitting rate calculation and display update to be provided at a one second rate.

For high speed inputs for rates above 1500 pulses per minute, the rate per minute is calculated once per second based upon averaging sixteen input pulses. For intermediate rates between 150 pulses per minute and 1500 pulses per minute, the rate per minute is calculated once per second based upon averaging four input pulses. For low speed rates up to 150 pulses per minute, the rate per minute is calculated each second using only one input pulse.

With receipt of the first event pulse of a series of event pulses, an interval timer is started. The number of pulses received is counted by an event counter and elapsed time is recorded by an elapsed time counter as the pulses are accumulated. The event counter and the elapsed time counter are internal to the microprocessor system.

To select the batch size to be used for a given rate calculation, a determination is made at boundary times as to the number of pulses accumulated. For example, when four pulses have been counted and if the elapsed time is less than 160 ms, this indicates that the pulses are being received at a high rate, and a sixteen count batch size is used. That is, sixteen pulses will be accumulated and the elapsed time measured until the sixteen pulses have been counted. If, however, four pulses have been counted at an elapsed time of 160 ms, then a four count batch size will be used. If only one pulse has been counted within an elapsed time of 400 ms, then a one count batch is used.

If the input rate varies, the system automatically adjusts to the proper range (i.e., batch size) as the slower or faster input rate is detected. When an event pulse fails to be detected within a ten second interval, defined by a ten-second timer, the display is zeroed and the system goes to a standby mode until a further train of event pulses is detected.

The rate monitor unit can be used in most rate monitoring applications since it responds to a wide variety of inputs including a change in the resistance of a photo-optic sensor, the closing of switch contacts, the signal output of a low level magnetic pick-up, or a voltage pulse. Manually settable factor switches scale the calculated rate to provide a readout in units such as revolutions per second, meters per second, inches per minute, etc. which are commensurate with the application.

DESCRIPTION OF THE DRAWINGS

FIG. 1 is a schematic circuit and partial block for a digital rate monitor apparatus provided by the present invention;

FIG. 2 is a flow chart illustrating the operation of the rate monitor apparatus during display and calculation;

FIG. 3 is a flow chart illustrating the operation of the rate monitor apparatus during processing of event pulses; and FIG. 4 is a representation of typical event pulses received.

DESCRIPTION OF A PREFERRED EMBODIMENT

Referring to FIG. 1, the digital rate monitor unit provided by the present invention is comprised of a data processing unit 11, a pulse shaping circuit 12, and a display unit 14, including a five-digit segmented LED display 15 and associated drive circuit 16. The pulse forming circuit 12 which serves as an interface between the data processing unit 11 and a source of event pulses, represented by block 13, responds to each event pulse to generate a logic level signal suitable for application to the data processing unit. The data processing unit 11 receives and processes event pulses provided by the source 13 and generates data representing the rate of the event pulses for display on the display unit 15.

The rate monitor unit can be used in most rate monitoring applications since it responds to a wide variety of inputs including a change in the resistance of a photo-optic sensor, the closing of switch contacts, the signal output of a low level magnetic pick-up, or a voltage pulse. Typical applications include measurement of the frequency of rotation of a shaft or other object, the rate of fluid flow through a conduit, counting the number of objects passing on a conveyor belt in a given time interval, or as a linear speed indicator. Manually settable factor switches 17 scale the calculated rate to provide a readout in units such as revolutions per second, meters per second, inches per minute, etc. which are commensurate with the application.

The rate monitor receives event pulses, averages the rate of input each second and multiplies the input rate by a preselected scale factor indicated by the factor switches 17 to provide a scaled rate for display. In accordance with the invention, to calculate the rate of the event pulses, the data processing unit accumulates a given number or batch of pulses and measures the elapsed time for accumulating such number of pulses. The number of pulses, or batch size for a given calculation is a function of the rate at which event pulses are being received by the data processing unit, and the data processing unit automatically selects a different batch size as the rate of the event pulses increases or decreases. In this description, the batch size may be one, four or sixteen and thus a batch of pulses may include either one, four or sixteen pulses. These batch sizes are selected for the purpose of describing one embodiment of the rate monitor, and other, or additional batch sizes may be used as a function of the application of the rate monitor.

More specifically, for high speed inputs for rates above 1500 pulses per minute, the rate per minute is calculated once per second based upon averaging sixteen input pulses. For intermediate rates between 150 pulses per minute and 1500 pulses per minute, the rate per minute is calculated once per second based upon averaging four input pulses. For low speed rates up to 150 pulses per minute, the rate per minute is calculated each second using only one input pulse.

With the receipt of the first event pulse of a series of event pulses, an interval timer is started. The number of pulses received is counted and time is recorded as the pulses are accumulated. The number of pulses sampled, that is, the batch size, is taken as large as possible depending upon the input rate and in a time permitting rate calculation and display update at a one second rate.

To determine the batch size to be used in calculating the rate, a determination is made at boundary times as to the number of pulses accumulated. For example, when four pulses have been counted and if the elapsed time is less than 160 ms, this indicates that the pulses are being received at a high rate, and a sixteen count batch size is used. That is, sixteen pulses will be accumulated and the elapsed time measured until the sixteen pulses have been counted. If, however, four pulses have been counted at an elapsed time of 160 ms, then a four count batch size will be used. If only one pulse has been counted within an elapsed time of 400 ms, then a one count batch is used.

Since a fixed count batch size is used, be it one, four or sixteen, a constant can be derived, and the elapsed time needed to count a given batch of pulses is divided into the constant to determine the rate. The formula to calculate the rate constant is as follows:

$$N \text{ (Rate Per Minute)} = \frac{60,000,000 \text{ usec/min} \times \text{Batch Count}}{80 \text{ usec times units} \times \text{elapsed time}}$$

A different constant is provided for each batch size. For a sixteen count batch size, the elapsed time in microseconds, is divided into a constant N1 of a value 12,000,000 which provides the rate per minute of the input pulses. For a four count batch size, the constant is N2 of a value 3,000,000. The constant N3 for a one count batch size is 750,000. In each case, the constant includes adjustment for the machine time which is 80 microseconds.

In summary, an interval timer is started with the receipt of the first pulse of a series of pulses. The pulses are accumulated and elapsed time is recorded. At boundary times, the number of pulses counted thus far and the elapsed time are determined and a batch size is selected so that the maximum number of pulses is sampled within one-half second or so of the rate calculation interval. When the number of pulses counted corresponds to the batch size selected, i.e. one, four or sixteen, the elapsed time recorded at such time is divided into the corresponding constant N1, N2 or N3 to determine the rate. The calculated rate is multiplied by the scale factor set by the factor switches 17 and the displayed rate is updated at a one-second rate.

Depending upon the rate of the incoming pulses, the batch size is automatically determined. For high speed input pulses at rates above 1500 pulses per minute, the rate per minute is calculated once per second based upon averaging 16 input pulses. For rates between 150 and 1500 pulses per minute, the rate per minute is calculated once per second base upon averaging four input pulses. For rates up to 150 pulses per minute, the rate per minute is calculated each second using only one input pulse.

If the input rate varies, the system automatically adjusts to the proper range (i.e., batch size) as the slower or faster input rate is detected. Also, when an input pulse fails to be detected within a ten second interval, defined by a ten-second timer, the display is zeroed and the system goes to a standby mode until a further train of input pulses is detected.

RATE MONITOR CIRCUIT

Considering the circuit of the rate monitor unit in more detail, with reference to FIG. 1, the data processor unit 11 is commercially available without program as an integrated circuit chip under the designation 8048/8748 from Intel Corp. Santa Clara, Calif. The data processing unit comprises a microprocessor system which includes an arithmetic unit 11a and a self-contained program memory and a data memory, both of which are represented by the dashed block 11b in FIG. 1. The unit also includes on-chip clock and reset and on-chip timer and interrupt logic (not shown). The clock frequency is determined by an external 6 mHz crystal oscillator 18 which sets the system clock rate at 80 microseconds. The chip has twenty-seven resident I/0 lines accessible by three I/0 ports P0, P1 and P2. A regulated DC supply (not shown) derives suitable DC voltages from a 120 VAC source for the microprocessor chip, the display unit, and pulse shaping circuit.

The processing system operates under program control to receive and process the input data and to control the display unit 14 to display the calculated rate. The pulse shaping circuit 12 has its input connected to the source (or sensor) 13 of event pulses, and its output connected to the interrupt input, at pin 6 of the unit, to control conditional branch logic (not shown) of the unit. The pulse shaping circuit 12 is basically an edge triggered one-shot circuit which provides a 25 microsecond pulse at the interrupt input of the microprocessor chip. The circuit 12 assures that only one interrupt will be generated for each change in state of the sensor.

The pulse shaping circuit is comprised of a one-shot circuit 12a and a trigger circuit 12b. The trigger circuit 12b includes a programmable unijunction transistor 31 having its gate biased at a level of approximately ⅔ VC by way of resistors 32 and 33. The anode of the PUT device 31 is biased at a level below that of its gate by resistor 34 and timing network 35, including capacitors 36 and 37, resistor 38, and diode 39 so that the PUT device 31 is normally cut off. The junction of resistor 38 and diode 39 is connected via resistor 40 and input 41 of the rate meter to the source 13 of event pulses.

In response to a positive going event pulse, the potential at the anode of the PUT device is raised above that of the gate, causing the PUT device to conduct. This permits the capacitors of the timing network to discharge through the PUT device, lowering the anode potential of the PUT device causing it to turn off. The switching of the PUT device on, effectively grounding its anode, causes a negative going pulse to be generated at the trigger input of the one-shot 12a which provides the 25 microsecond interrupt signal at pin 6 of the chip. Once the PUT device has turned off, it cannot be turned on again until the capacitors of the timing network are recharged. This delay provides the hysteresis to prevent false triggering of the one-shot 12a.

The factor switches 17 comprise five switches 17a–17e, shown functionally as including four switches S1–S4 and four isolation diodes D1–D4. Each switch provides a four bit binary coding for a different one of the digits of the scale factor. Although each switch 17a–17e is illustrated as a set of four discrete switches and associated isolation diodes, each switch is, for example, a thumbwheel switch calibrated, or numbered, from 0 to 9, allowing the using to enter the desired scale factor by setting the five switches 17a–17e to the appropriate numbers. The factor switches allow the calculated rate to be multiplied by any factor from 0.0001 to 9,999 as a function of the setting of the switches, before being displayed. This permits the input rate to be represented directly in units of revolutions per hour, meters per second, inches per minute or whatever units are desired depending upon the particular application. If desired, one of the sets of digit switches, such as set 17e, may be used to provide a four bit coding for positioning or locating a decimal point on the display unit 15. The four diodes D1–D4 of each set of digit switches 17a–17e have their anodes connected to pins 35–38 of the chip, which are inputs to four lines of I/0 port P2. Switches 17a–17d are connected to pins 21–24, respectively, which are inputs to the other four lines of I/0 port P2. The other switch 17e is connected at pin 34 to an available I/0 line of port P1.

Referring to the display 14, the display 15 comprises a five digit, segmented LED display. The data processing unit 11 provides five digit select outputs over I/0 lines connected to pins 27–31 of port P1 to which are connected a digit select circuit 16a of the display drive circuits 16. The digit select circuit 16a, which may be the type 2003, drives select lines S1–S5 to select one of the five digits of the display unit. Segment select outputs are provided in the form of a four bit BCD word over data outputs pins 12–15, of port P0 to a segment select circuit 16b which energizes select drive lines A–G for the display unit.

As indicated herein above, the microprocessor operates under program control to receive and process the input data and to display the rate calculated on the display unit. The program consists of a main routine, the flow chart for which is shown in FIG. 2, and an interrupt routine, the flow charge for which is shown in FIG. 3. A program listing is provided in Appendix I.

The main routine controls the initialization of the microprocessor circuits, the calculation of the rate, the scaling of the calculated rate, and the display of the resultant calculation. The interrupt routine, which is entered each time an event pulse is received, controls the reset of the ten second interval timer and the event pulse counter, the incrementing of the event counter with each pulse received, the selection of the batch size for each calculation, and the transfer to the calculation routine when the number of pulses in the selected batch has been accumulated in the event counter. The ten second counter and the event pulse counter are software implemented and are represented by the dashed blocks 11c and 11d, respectively at the upper portion of the memory 11b shown in FIG. 1.

More specifically, referring to FIG. 2, the microprocessor circuits are initialized at block 51, and the ten second interval timer 11c is started at block 52. Block 53 enables the calculated rate to be displayed. If no event pulses are being received, the display is zeroed. When event pulses are being received, the most recently calculated rate is displayed with the information displayed being updated at one second intervals. Whenever an event pulse fails to be received within a ten second interval, as determined at block 54, the program loops back to block 51 and the system is reinitialized and the ten second timer is restarted.

During each ten second period, the most recently calculated data is transferred to the display each second, blocks 55 and 56, to update the displayed data.

If less than one second has elapsed, the program at block 57 determines if data is available for a rate calculation as indicated by a control output "compute flag set" provided by the interrupt routine. If no data is available for computation, the program returns to block 53 and displays the current rate. If the compute flag is set, then the calculation routine is entered, and a rate calculation is effected.

Blocks 58–61 comprise the calculation routine which is entered into each time the compute flag is set. Block 58 enables the unfactored rate to be calculated using the constant (related to batch size) and elapsed time data provided by the interrupt routine. Block 59 enables the scale factors (set by factor switches 17) to be read and block 61 enables the rate is to be saved for the next display update (block 56) and the program returns to block 53 to display the current rate. The current rate is displayed until updated (block 56) at the end of each one second period.

Referring to FIG. 3, the interrupt routine is entered each time an event pulse is detected, and at block 71 enables the ten second interval timer to be restarted. Block 72 enables a test to be made to determine whether or not the event pulse received is the first pulse in a series. If so, block 73 enables the interval timer 11c and the pulse timer 11d to be reset and at block 74, the subroutine exits to the main program. When the event pulse received is not the first pulse of a series, block 72 enables the program to advance to block 75 to increment the pulse counter PC, which is part of the data memory 11b (FIG. 1). Blocks 77–80 determine the batch size, i.e. the number of pulses to be accumulated for a given calculation, the batch size being a function of the rate of the event pulses being received.

When a sixteen count batch size is selected, block 76 determines if the pulse counter PC has registered a count of sixteen. If so, the constant N1, which is 12,000,00 in this example, is designated for use in the calculation routine and the program jumps to block 85 to read the elapsed time from the elapsed time counter and to store the elapsed time for the calculation routine. Block 86 causes the compute flag to be set and the interrupt program exits to the main program at block 87. If, for a sixteen count batch size, sixteen pulses have not yet been counted, the program proceeds through blocks 77, 79 and 82, for example, and returns to the main program.

For a four count batch size, block 77 indicates when four pulses have been counted. Block 78 reads the elapsed time counter to determine if 160 milliseconds have elapsed by comparing the elapsed time registered by the interval timer 11C with a preselected time 160 milliseconds which is stored in the memory. If not, this indicates that the input rate is faster than that for a four count batch size, in effect selecting a sixteen count batch size, and at block 81, the subroutine exits to the main program. If only four pulses have been counted at 160 ms, then a four count batch size is selected. Block 83 enables the constant N2, which is 3,000,000 in this example, to be loaded into memory for use in the calculation of the rate. From block 83, the program jumps to block 85 to read and store the elapsed time and at block 86 causes the compute flag to be set.

Block 79 indicates when one pulse has been counted. Block 80 reads the elapsed time counter to determine if 400 milliseconds have elapsed by comparing the elapsed time registered by the interval timer 11C with a preselected time 400 milliseconds stored in the memory. If so, this indicates that the rate is that for a one count batch size, and block 84 enables the constant N3, 750,000 in this example, to be loaded into memory for use in the rate calculation. From block 84, the program proceeds to block 85 to read and store the elapsed time and at block 86 causes the compute flag to be set. At block 87, the subroutine exits to the main program.

If a single pulse is counted in less than 400 milliseconds, indicative of an input rate faster than that for a one count batch, the program exits to the main routine at block 88. Also, block 82, provides an exit to the main routine for the case when no event pulses have yet been counted, as is the case when the first pulse of a series of event pulses is received. As indicated, the first pulse of each series of pulses serves to "initialize" the ten second interval counter, the elapsed time counter and the event pulse counter, and this initializing pulse is not registered by the event pulse counter. Also, it is pointed out that in response to the detection of an event pulse, the interrupt routine is not entered if the main program is effecting a calculation.

OPERATION

In using the rate monitor, the unit is energized by connecting its power suply circuit (not shown) to a 120 VAC source. The rate monitor input, at pulse shaping circuit 12, is connected to the output of the source 13 of event pulses, which is assumed, initially, not to be providing event pulses.

To illustrate the operation of the rate monitor, it is assumed that event pulses to be provided by the source 13 will be at the rate of 1200 pulses per minute, and that the rate displayed is to be in units of cycles (or Hertz) per second. Accordingly, the factor switches 17 are set to provide a factor of 0.0167 that the calculated rate will be multiplied by a factor 0.0167.

Referring to FIG. 2, when rate monitor unit is energized, and in the absence of event pulses, the microprocessor circuits are initialized at block 51, and at block 52, the ten second interval timer 11c is started. Block 53 causes the current rate to be displayed initially. Since no event pulses are supplied to the rate monitor, the display will show all zeroes. The microprocessor circuits will be reinitialized every ten seconds until event pulses are detected.

Referring again to FIG. 1, when the source 13 begins to provide event pulses, the first pulse of the pulse train, shown in FIG. 4, enables the trigger circuit 12b to generate a trigger signal for one-shot circuit 12a which responsively causes the interrupt input, at pin 6, of the microprocessor to go low for 25 microseconds. Accordingly, the initializing routine of the main program is interrupted, and the interrupt routine (FIG. 3) is entered. It is pointed out that each event pulse received causes the pulse shaping circuit 12 to generate an interrupt signal for the microprocessor unit.

Referring now to FIG. 3, with the receipt of the first event pulse of the pulse train (FIG. 4), the ten second timer 11c is restarted at block 71. Since this is the first pulse of the pulse train, at block 72, the program advances to block 73 to clear the elapsed time interval counter 11d and the event pulse counter PC. The program then exits at block 74 to the main routine to the point at which the main routine was interrupted when the first event pulse was received. Since no calculation has yet been made, the main program will continue to cause the display to read zero.

When the second pulse of the event pulse train is received, the main routine is interrupted and the interrupt routine (FIG. 3) is re-entered. The ten second timer is again restarted at block 71 to prevent a time out condition which would result in resetting of the microprocessor circuits. The program advances from block 72 to block 75, since this is the second pulse, and increments the pulse counter to a count of one. Since only one event pulse has been registered, the program advances through blocks 76, 77 and 79 to block 80. Since the input rate is 1200 pulses per minute, event pulses will be received at a 50 millisecond rate. Accordingly, since the first pulse is counted in less than 400 milliseconds, then from block 80, the main program is entered at block 88.

The interrupt routine is re-entered with the receipt of each of the next two event pulses and operations described above are repeated. However, when the fourth pulse has been counted, the elapsed time counter registers 200 milliseconds. Block 77 causes the elapsed timer to be read, and since the boundary time of 160 milliseconds has been exceeded, block 83 causes the constant N2, that is 3,000,000, to be loaded into the memory along with the elapsed time of 200 milliseconds. Block 86 causes the compute flag to be set and at block 87, the main routine is re-entered.

Referring to FIG. 2, the next time block 57 is reached, the program advances to block 58 since the compute flag is set. Block 58 calculates the unfactored rate using the constant N2 and elapsed time, 200 milliseconds, which was registered by the elapsed time counter. In calculating the rate, the constant 3,000,000 is divided by the elapsed time of 200 milliseconds (divided by the machine time of 80 microseconds) providing an unfactored rate of 1200 pulses per minute. Block 59 reads the settings of the factor switches 17, and block 60 multiplies the unfactored rate by the scaling factor 0.0167 set on the factor switches. Block 61 stores the factored rate of 20 pulses per second for the next display update, and the program advances from block 61 to block 63 where the current stored rate, which is still zero, is displayed. The most recently calculated rate is not displayed until after the program advances to block 56 and causes the most recently calculated rate to be transferred to the display.

The microprocessor calculates the rate as each subsequent four count batch of pulses is received, and the rate displayed is updated each second. If for any reason the rate of the input pulses should increase (or decrease), the interrupt routine at blocks 76–80 detects such change and selects a sixteen (or one) count batch size.

For example, assuming that the speed of the input pulses decreases from 1200 pulses per minute to a rate of 150 pulses per minute, as indicated by the pulses 90 in the right-hand portion of FIG. 4, the microprocessor will automatically adapt to this change and select a one count batch size for the next "series" of pulses received.

More specifically, assuming that pulse 91 (FIG. 4) is the first pulse of a series of pulses, that is, the pulse which causes the ten second interval timer, the elapsed time counter and the event pulse counter to be initialized (at block 73), then the elapsed time until the next pulse 92 is received (and counted) is 400 milliseconds. Accordingly, block 79 causes the elapsed time counter to be read, and since the elapsed time is 400 milliseconds, the program advances to block 84, and causes constant N3 (for a one count batch) to be used in the next rate calculation.

Similarly, should the input rate increase above 1500 pulses per minute, then more than four pulses will be counted before 160 milliseconds have elapsed, and when a count of sixteen is reached, the constant N1 is selected at block 98 for the rate calculation.

Referring to FIG. 2, whenever event pulses fail to be received for an interval ten seconds or longer, then at block 54, the program advances to block 51 to again initialize the microprocessor circuits and the unit goes in a standby mode awaiting a further series of event pulses.

Having thus disclosed in detail a preferred embodiment of my invention, persons skilled in the art will be able to modify certain of the structure which has been disclosed and to substitute equivalent elements for those which have been illustrated. It is, therefore, intended that all such modifications and substitutions be covered as they are embraced within the spirit and scope of the appended claims.

Appendix I
Program Listing

```
LOC  OBJ        SEQ         SOURCE STATEMENT

158 .. EQUATES
0022            159 T10SR  EQU  022H
0023            160 T1SECR EQU  023H
0028            161 DISP   EQU   28H
0029            162 RATMSD EQU   29H
002B            163 RATLSD EQU   2BH
002C            164 OFRLST EQU  02CH
002D            165 TREG   EQU  02DH
002E            166 OTLAST EQU  02EH
002F            167 DPPTR  EQU   2FH
0030            168 XERMSD EQU   30H
0031            169 XER    EQU   31H
0033            170 TLAST  EQU   33H
0035            171 SUBCMS EQU   35H
0037            172 SUBC   EQU   37H
0038            173 MINMSD EQU   38H
003A            174 MIN    EQU   3AH
```

```
003D                175 SUB       EQU    3DH
003F                176 FLAG1     EQU    3FH
                    177 ;
                    178 ; INITIALIZE ROUTINE AND EXECUTIVE.
0000                179           ORG    0H
0000 0408           180 STARTV    JMP    START     ; START VECTOR.
0002 00             181           NOP
0003 0481           182 INTV      JMP    INT
0005 00             183           NOP
0006 00             184           NOP
0007 93             185 TINTV     RETR
                    186 ;;;;;;;;;;;;;;;;;;;;;;;;
0008 15             187 START     DIS    I
0009 35             188           DIS    TCNTI
000A E5             189           SEL    MB0
000B C5             190           SEL    RB0
000C 85             191           CLR    F0
000D A5             192           CLR    F1        ; RES ZS FL.
                    193 ; CLEAR RAM
000E B83F           194           MOV    R0,#3FH   ;R0=LOOP CTR.
0010 B000           195 CLRAM     MOV    @R0,#0    ;AND POINTER.DONE?
0012 E810           196           DJNZ   R0,CLRAM  ;NO, CONT.
                    197 ; CLEAR I/OS
0014 9800           198           ANL    BUS,#0    ;YES.
0016 9900           199           ANL    P1,#0
0018 9A00           200           ANL    P2,#0
001A B822           201           MOV    R0,#T1SECR ;INIT 1 SEC TIMER
001C B019           202           MOV    @R0,#25D
                    203 ; EXECUTIVE
                    204 ;
001E 27             205           CLR    A         ; INIT T.
001F 62             206           MOV    T,A
0020 55             207           STRT   T
0021 05             208 EX0:      EN     I
0022 74A7           209 EX        CALL   DSPLAY    ; REFRESH DISPLAY.
0024 B83F           210           MOV    R0,#FLAG1 ; 10 SEC O/F?
0026 F0             211           MOV    A,@R0
0027 F208           212           JB7    START     ; SET, NO INPUT, SET RATE=0.
                    213 ;                          ; NOT SET, SYNC FL?
0029 D222           214           JB6    EX        ; SET, LOOP BACK.
002B 3231           215           JB1    EX2       ; NOT SET, T1SECFL?
002D 7248           216 EX3:      JB3    EX1       ; NOT SET, COMRAF?
002F 0422           217           JMP    EX        ; NOT SET, RETURN

LOC  OBJ            SEQ           SOURCE STATEMENT

218 ;
0031 B82B           219 EX2:      MOV    R0,#RATLSD  ;T1SEC=1.
0033 B928           220           MOV    R1,#DISP
0035 123F           221           JB0    EX4         ;ERR FL?
0037 7414           222           CALL   ROTOR1      ;NS, MOVE RATE TO DISP.
0039 23FD           223 EX6:      MOV    A,#0FDH     ; RESET T1SEC FL.
003B 14F6           224           CALL   RESFL1
003D 042D           225           JMP    EX3
003F BF03           226 EX4:      MOV    R7,#3H      ;ERR FL=1, LOAD 999999.
0041 B199           227 EX5:      MOV    @R1,#99H
0043 C9             228           DEC    R1
```

```
0044 EF41      229          DJNZ   R7,EX5
0046 0439      230          JMP    EX6
               231 ;
0048 15        232 EX1:     DIS    I          ; SET, COMPUTE RATE.
0049 23FE      233          MOV    A,#0FEH    ; RES ERR FL.
004B 14F6      234          CALL   RESFL1
004D 3437      235          CALL   BTDR       ; CONVERT 2C/2D TO DEC(3B/3D).
004F 741D      236          CALL   CR         ; DISPLAY RATE.
0051 B82B      237          MOV    R0,#RATLSD         ; RATE-->XAND
0053 B93D      238          MOV    R1,#SUB
0055 7414      239          CALL   ROTOR1
0057 5417      240          CALL   MULT
0059 23F7      241          MOV    A,#0F7H
005B 14F6      242 EX1A     CALL   RESFL1     ; RES COMRAF FL.
005D 0421      243          JMP    EX0
               244 ;;;;;;;;;;;;;;;;;;;;;;;;;;;;;;;;;;;;;;;
               245 ; TINT: TIMER OVERFLOW INTERRUPT ROUTINE.
               246 ; ENTER FOR EVERY 256 COUNT (256*80US)=20.48 MS.
               247 ; INCR O/F REG IF TIMER O/F.
               248 ; USES A,R0.
               249 ;
005F 1663      250 TPOLL:   JTF    TINT1      ; TIMER O/F?
0061 047E      251          JMP    RTPOLL     ; NO, RETURN.
0063 1D        252 TINT1    INC    R5         ; YES, INCR O/F REG.
0064 B823      253          MOV    R0,#T1SECR ; DECR T1SEC REGISTER.
0066 F0        254          MOV    A,@R0
0067 07        255          DEC    A          ; T1SEC 0?
0068 967F      256          JNZ    TINT3      ; NO.
               257 ;
006A B019      258          MOV    @R0,#25D   ; INIT T1SEC TIMER.
006C 2302      259          MOV    A,#02H     ; SET T1SEC FLAG.
006E 14F1      260          CALL   SETFL1
               261 ;
0070 B822      262 TINT4    MOV    R0,#T10SR  ; 10 SEC UP?
0072 F0        263          MOV    A,@R0
0073 10        264          INC    @R0        ; INCR T10SR.
0074 0301      265          ADD    A,#1H      ; 10 SEC UP?
0076 D305      266          XRL    A,#05H
0078 967E      267          JNZ    RTPOLL
               268 ;
007A 2280      269 TINT2    MOV    A,#80H     ; YES, SET T10SFL.
007C 14F1      270          CALL   SETFL1
007E 83        271 RTPOLL:  RET
               272 ;

LOC  OBJ       SEQ          SOURCE STATEMENT

007F A0        273 TINT3    MOV    @R0,A      ; UPDATE T1SECTIMER
0080 83        274          RET
               275 ;;;;;;;;;;;;;;;;;;;;;;;;;;;;;;;;;;;;;;;
               276 ;
               277 ; INTERRUPT ROUTINE.
               278 ; USES A,R0,R1.
               279 ; R4=INPCNT,R5=OREG, IN RB1.
               280 ; 1 PULSE - FORMULA 1.RANGE 0 TO 150 CPM
               281 ; R1= 750000/N
               282 ; 4 PULSES. FORMULA 2: 150 TO 1500 CPM
```

```
                283 ; R4= 3000000/N
                284 ; 16 PULSES: FORMULA 3: 1500 CPM UP TO DISPLAY FAIL
                285 ; R16 = 12,000,000/N
0081 D5         286 INT:    SEL     RB1
0082 B83E       287         MOV     R0,#3EH         ; SAVE A.
0084 A0         288         MOV     @R0,A
                289 ;
0085 B822       290         MOV     R0,#T10SR       ; CLEAR T10 SEC REG.
0087 B000       291         MOV     @R0,#0H
                292 ;
0089 B83F       293         MOV     R0,#FLAG1       ; SYNC FL?
008B F0         294         MOV     A,@R0
008C D2A0       295         JB6     INT1            ; SET.
                296 ;
008E 2340       297         MOV     A,#40H          ; NOT SET, SET IT.
0090 14F1       298         CALL    SETFL1
                299 ;
0092 42         300         MOV     A,T             ; READ TIMER VALUE.
0093 55         301         STRT    T               ; CLR PRESCALER.
0094 1696       302         JTF     NEXT            ; CLR T O/F FLAG.
0096 37         303 NEXT:   CPL     A               ; 2'S COMP OF TIMER VALUE.
0097 17         304         INC     A
0098 B82E       305         MOV     R0,#OTLAST      ; SAVE OLD TLAST,
009A A0         306         MOV     @R0,A
                307 ;
009B 27         308         CLR     A
009C AD         309         MOV     R5,A            ; CLR O/F REG.
009D AC         310         MOV     R4,A            ; CLR INPCNT.
009E 04EC       311         JMP     RINT
                312 ;
00A0 97         313 INT1:   CLR     C
00A1 B83A       314         MOV     R0,#MIN         ; FOR FUTURE USE.
00A3 1C         315         INC     R4              ; SYNC FL IS SET, IN INPCNT.
00A4 FC         316         MOV     A,R4
00A5 03F0       317         ADD     A,#0F0H         ; INPCNT=16?
00A7 F6C8       318         JC      INT16P
00A9 030C       319         ADD     A,#0CH          ; NO, INPCNT=4?
00AB C6BE       320         JZ      INT4P           ; YES.
00AD 0303       321         ADD     A,#03H          ; NO, INPCNT=1?
00AF 96EC       322         JNZ     RINT            ; NO.
00B1 97         323         CLR     C
00B2 FD         324         MOV     A,R5            ; YES, T GT 400 MS?
00B3 03EC       325         ADD     A,#0ECH         ; (TREG GE 20?)
00B5 E6EC       326         JNC     RINT            ; NO.
00B7 B000       327 INT1P:  MOV     @R0,#00         ; YES, FORMULA 1 (BET 2 PULSES).

LOC  OBJ        SEQ         SOURCE STATEMENT

00B9 C8         328         DEC     R0              ; R=(750000/N).
00BA B075       329         MOV     @R0,#75H
00BC 04CD       330         JMP     INT16A
00BE FD         331 INT4P:  MOV     A,R5            ; T GE 160 MS?
00BF 97         332         CLR     C
00C0 03F8       333         ADD     A,#0F8H         ; (TREG GE 8?)
00C2 E6EC       334         JNC     RINT            ; NO, COUNT 16.
00C4 B003       335         MOV     @R0,#03H        ; YES, 3000000->MIN.
00C6 04CA       336         JMP     INT16B
```

```
00C8 B012       337 INT16P: MOV    @R0,#12H       ; 16 PULSE ,12000000->MIN
00CA C8         338 INT16B: DEC    R0
00CB B000       339         MOV    @R0,#00H
00CD C8         340 INT16A: DEC    R0
00CE B000       341         MOV    @R0,#00H
                342 ;;;;;;;;;;;;;;;;;;;;;;;;;;;;;;;;;;;;;
00D0 42         343 INT2:   MOV    A,T            ; READ TIMER VALUE.
00D1 B833       344         MOV    R0,#TLAST      ; SAVE T AT TLAST.
00D3 A0         345         MOV    @R0,A
                346 ;
00D4 B82E       347         MOV    R0,#OTLAST     ; TLAST + (256-OTLAST) = ?
00D6 60         348         ADD    A,@R0
00D7 B82D       349         MOV    R0,#TREG       ; SAVE IN TREG.
00D9 A0         350         MOV    @R0,A
00DA 44D1       351         JMP    TP0            ;**** PATCH 0 ******
                352 ;
                353 ;
                354 ;
00DC FD         355 INT5:   MOV    A,R5           ; SAVE OFREG AT OFRLST FOR CALC.
00DD C6E1       356         JZ     INT6           ; OFREG = 0?
00DF 07         357         DEC    A              ; DECR FOR CORRECTION.
00E0 AD         358         MOV    R5,A
00E1 B82C       359 INT6:   MOV    R0,#OFRLST
00E3 A0         360         MOV    @R0,A
                361 ;
00E4 2308       362         MOV    A,#08H         ; SET COMRAF FL.
00E6 14F1       363 INT7:   CALL   SETFL1
                364 ;
00E8 23BF       365         MOV    A,#0BFH        ; RES SYNC FL.
00EA 14F6       366         CALL   RESFL1
                367 ;
00EC B83E       368 RINT:   MOV    R0,#3EH        ; RETRIEVE A.
00EE F0         369         MOV    A,@R0
00EF C5         370         SEL    RB0
00F0 93         371         RETR
                372 ;;;;;;;;;;;;;;;;;;;;;;;;;;;;
00F1 B83F       373 SETFL1: MOV    R0,#FLAG1      ; SET BIT IN FLAG1.
00F3 40         374         ORL    A,@R0
00F4 A0         375         MOV    @R0,A
00F5 83         376         RET
00F6 B83F       377 RESFL1: MOV    R0,#FLAG1      ; RES BIT IN FLAG1.
00F8 50         378         ANL    A,@R0
00F9 A0         379         MOV    @R0,A
00FA 83         380         RET
                381 ;;;;;;;;;;;;;;;;;;;;;;;;;;;;
                382 ; SUB5F3.

LOC OBJ         SEQ        SOURCE STATEMENT

383 ; SUBTRACT R3/R4 FROM R5/R6 AND STORE THE RESULT
                384 ; IN R1/R2.
                385 ; SET CARRY IF SUB IS GREATER THAN MINUEND.
                386 ;;;;;;;;;;;;;;;;;;;;;;;;;
0100            387         ORG    100H
                388 ;;;;;;;;;;;;;;;;;;;;;;;;;
0100 FC         389 SUBR:   MOV    A,R4           ; 2'S COMP OF SUBLO.
0101 37         390         CPL    A
```

```
0102 0301        391           ADD     A,#1H
0104 AA          392           MOV     R2,A
0105 FB          393           MOV     A,R3    ; 2'S COMP OF SUBHI.
0106 37          394           CPL     A
0107 1300        395           ADDC    A,#0H
0109 A9          396           MOV     R1,A
                 397 ;
010A 97          398           CLR     C
010B FE          399           MOV     A,R6    ; ADD MINLO+SUBLO.
010C 6A          400           ADD     A,R2
010D AA          401           MOV     R2,A
010E FD          402           MOV     A,R5
010F 79          403           ADDC    A,R1
0110 A9          404           MOV     R1,A
0111 97          405           CLR     C       ; O/F?
0112 F215        406           JB7     SEC
0114 83          407           RET             ; NO, RES C.
0115 A7          408 SEC:      CPL     C       ; YES, SET CARRY.
0116 83          409           RET
                 410 ;;;;;;;;;;;;;;;;;;;;;;;;;;;;;;;
                 411 ; SWAP R1/R2 WITH R5/R6.
0117 1F          412 UPDEC:    INC     R7      ; INCR DEC DIG.
0118 29          413 X12W56:   XCH     A,R1
0119 2D          414           XCH     A,R5
011A 29          415           XCH     A,R1
011B 2A          416           XCH     A,R2
011C 2E          417           XCH     A,R6
011D 2A          418           XCH     A,R2
011E 83          419           RET
                 420 ;;;;;;;;;;;;;;;;;;;;;;;;;;;;
                 421 ; STDEC
                 422 ; STORE R7 AT @R0,DECR POINTER R0,CLEAR R7.
                 423 ;;;;;;;;;;;;;;;;;;;;;;;;;;;;
011F 95          424 STDEC:    CPL     F0      ; COMPL NIB FL.
0120 B624        425           JF0     STDEC1  ; NF?
0122 2425        426           JMP     STDEC4  ; NS.
0124 18          427 STDEC1:   INC     R0      ; SET,DECR PTR.
0125 B62C        428 STDEC4:   JF0     STDEC5  ; SET,NF?
0127 F0          429           MOV     A,@R0   ; NS,LO NIBBLE.
0128 53F0        430           ANL     A,#0F0H ; MASK HN.
012A 2432        431           JMP     STDEC6
012C FF          432 STDEC5:   MOV     A,R7    ; SET,HI NIB,ADJ R7.
012D 47          433           SWAP    A
012E AF          434           MOV     R7,A
012F F0          435           MOV     A,@R0
0130 530F        436           ANL     A,#0FH
0132 4F          437 STDEC6:   ORL     A,R7

LOC  OBJ         SEQ           SOURCE STATEMENT

0133 A0          438           MOV     @R0,A
0134 BF00        439           MOV     R7,#0H
0136 83          440           RET
                 441 ;;;;;;;;;;;;;;;;;;;;;;;;;;;;;;;;;;;
                 442 ; BTDR:
                 443 ; CONVERT RATE FROM BINARY (2C/2DLSD) TO DECIMAL.
                 444 ; STORE IT IN RAM @LTISPLAY AREA (3B-3D LSD).
```

```
                    445 ; ZERO SUPPRESS.
                    446 ;
0137 B83D           447 BTDR:   MOV    R0,#SUB    ;CLR SUB.
0139 34C1           448         CALL   CLREG
013B B82D           449         MOV    R0,#TREG   ;TLAST->R6.
013D F0             450         MOV    A,@R0
013E 97             451         CLR    C
013F F7             452         RLC    A          ;TIMES 2 SO SHIFT BOTH WORDS ONCE THRU C
0140 AE             453         MOV    R6,A
0141 C8             454         DEC    R0
0142 F0             455         MOV    A,@R0
0143 F7             456         RLC    A
0144 97             457         CLR    C
0145 AD             458         MOV    R5,A
                    459 ;
0146 85             460         CLR    F0         ;RESNIB FL.
0147 95             461         CPL    F0
0148 B83B           462         MOV    R0,#3BH    ; POINTER FOR MSD.
014A BB27           463         MOV    R3,#27H    ;SUBTRACT 10,000.
014C BC10           464         MOV    R4,#10H
014E BF00           465         MOV    R7,#0H
0150 3400           466 BTDR1:  CALL   SUBR       ; O/F?
0152 F658           467         JC     BTDR2
0154 3417           468         CALL   UPDEC      ; NO, REM-->MIN., INCR DEDEC (R7).
0156 2450           469         JMP    BTDR1      ; DO AGAIN
0158 341F           470 BTDR2:  CALL   STDEC      ; YES, STORE DIGIT.
015A BB03           471         MOV    R3,#03H    ; SUB 1000.
015C BCE8           472         MOV    R4,#0E8H
015E 3400           473 BTDR3:  CALL   SUBR       ; O/F?
0160 F666           474         JC     BTDR4
0162 3417           475         CALL   UPDEC      ; NO, INCR DEC, REM->MIN.
0164 245E           476         JMP    BTDR3      ; DO IT AGAIN.
0166 341F           477 BTDR4:  CALL   STDEC      ; YES, STORE DEC DIG.
0168 BB00           478         MOV    R3,#0H     ; DO HUNDREDS.
016A BC64           479         MOV    R4,#64H
016C 3400           480 BTDR5:  CALL   SUBR       ; O/F?
016E F674           481         JC     BTDR6
0170 3417           482         CALL   UPDEC      ; NO, INCR DEC DIG.
0172 246C           483         JMP    BTDR5
0174 341F           484 BTDR6:  CALL   STDEC      ; YES, STORE DEC DIG.
0176 BC0A           485         MOV    R4,#0AH    ; DO TENS.
0178 3400           486 BTDR7:  CALL   SUBR       ; O/F?
017A F680           487         JC     BTDR8
017C 3417           488         CALL   UPDEC      ; NO, INCR DEC DIG.
017E 2478           489         JMP    BTDR7      ; DO AGAIN.
0180 341F           490 BTDR8:  CALL   STDEC      ; YES, STORE DEC DIG.
0182 F0             491         MOV    A,@R0
0183 53F0           492         ANL    A,#0F0H

LOC  OBJ            SEQ        SOURCE STATEMENT 0185 4E             493         ORL    A,R6
0186 A0             494         MOV    @R0,A
0187 83             495         RET
                    496 ;;;;;;;;;;;;;;;;;;;;;;;;;;;
                    497 ;;;;;;;;;;;;;;;;;;;;;;;;;;;
                    498 ; NC:
```

```
                  499 ; THIS ROUTINE FINDS 9' COMPLEMENT OF A 3 BYTE REGISTER
                  500 ; POINTED TO BY R0 AT LSD. # IS IN R0,R0-1,R0-2.
0188 BF03         501 NC:    MOV    R7,#3
018A F0           502 NCA:   MOV    A,@R0        ; LOW NIBBLE FIRST.
018B 37           503        CPL    A            ; COMPUTE (9-N),
018C 030A         504        ADD    A,#0AH       ; WHERE N IS 3 IN BCD FORM PACKED.
018E 530F         505        ANL    A,#0FH       ; MASK OFF HNIB.
0190 20           506        XCH    A,@R0        ; SAVE IT.
                  507 ;
0191 37           508        CPL    A            ; DO HI NIBBLE.
0192 03A0         509        ADD    A,#0A0H
0194 53F0         510        ANL    A,#0F0H      ; MASK LOW NIB.
0196 40           511        ORL    A,@R0        ; SAVE IT.
0197 A0           512        MOV    @R0,A
0198 C8           513        DEC    R0
0199 EF8A         514        DJNZ   R7,NCA       ; NOT DONE,AGAIN.
019B 18           515        INC    R0           ; DONE,ADD 1 FOR 9'S COMPLEMENT.
019C 18           516        INC    R0
019D 18           517        INC    R0
019E 10           518        INC    @R0
019F 83           519        RET
                  520 ;;;;;;;;;;;;;;;;;;;;;;;;;;;;;;;
                  521 ; SHN: SHIFT BCD PACKED DATA BY NO OF BITS IN A.
                  522 ; LOAD ZEROES IN PLACE OF LSD.
                  523 ; R0 POINTS TO LSD,REG IS IN R0,R0-1,R0-2.
                  524 ;;;;;;;;;;;;;;;;;;;;;;;;;;;;;;;
01A0 B904         525 SHLFT: MOV    R1,#4        ; BIT CTR.
01A2 BF03         526 SHLA:  MOV    R7,#3        ; REG LENGTH.
01A4 97           527        CLR    C
01A5 F0           528 SHLB:  MOV    A,@R0        ; LOAD LSD IN A.
01A6 F7           529        RLC    A
01A7 A0           530        MOV    @R0,A
01A8 C8           531        DEC    R0
01A9 EFA5         532        DJNZ   R7,SHLB      ; NOT DONE,AGAIN.
                  533 ;
01AB 18           534        INC    R0
01AC 18           535        INC    R0
01AD 18           536        INC    R0           ; N = 0?
01AE E9A2         537        DJNZ   R1,SHLA      ; NO,REPEAT
01B0 83           538        RET
                  539 ;;;;;;;;;;;;;;;;;;;;;;;;;;;;;;;
                  540 ; ADMIN:
                  541 ; MINUEND + REG --> MINUEND.
                  542 ; ADDITION IS IN BCD,R0 POINTS TO LSD OF REG
                  543 ;
01B1 74A7         544 ADMIN  CALL   DSPLAY
01B3 B93A         545        MOV    R1,#MIN
01B5 BF03         546        MOV    R7,#3
01B7 97           547        CLR    C

LOC  OBJ          SEQ        SOURCE STATEMENT

01B8 F0           548 ADMINA: MOV   A,@R0
01B9 71           549        ADDC   A,@R1
01BA 57           550        DA     A
01BB A1           551        MOV    @R1,A
01BC C8           552        DEC    R0
```

```
01BD C9         553         DEC     R1
01BE EFB8       554         DJNZ    R7,ADMINA
01C0 83         555         RET
                556 ;;;;;;;;;;;;;;;;;;;
01C1 BF03       557 CLREG:  MOV     R7,#3H
01C3 B000       558 CLREG1: MOV     @R0,#0H
01C5 C8         559         DEC     R0
01C6 EFC3       560         DJNZ    R7,CLREG1
01C8 83         561         RET
                562 ;;;;;;;;;;;;;;;;;;;
01C9 2305       563 RNDUP:  MOV     A,#05H   ; REG+5-->REG.
01CB BF03       564         MOV     R7,#3H
01CD 97         565         CLR     C
01CE 70         566 RNDUPA: ADDC    A,@R0
01CF 57         567         DA      A
01D0 A0         568         MOV     @R0,A
01D1 27         569         CLR     A
01D2 C8         570         DEC     R0
01D3 EFCE       571         DJNZ    R7,RNDUPA
01D5 18         572         INC     R0       ; R0-->MSD.
01D6 B904       573         MOV     R1,#4    ; SHIFT RYT BY 1 DIGIT.
01D8 BF03       574         MOV     R7,#3H   ;NOTE R0 POINTS TO MSD.
01DA 24E1       575         JMP     SHRB
                576 ;;;;;;;;;;;;;;;;
                577 ; SHR:
                578 ; SHIFT RYT ,FILL WITH LEAD ZEROES.
                579 ; ENTER WITH R0 POINTING TO MSD.
01DC B904       580 SHRYT:  MOV     R1,#4
01DE BF03       581 SHRA:   MOV     R7,#3
01E0 97         582         CLR     C
01E1 F0         583 SHRB:   MOV     A,@R0
01E2 67         584         RRC     A
01E3 A0         585         MOV     @R0,A
01E4 18         586         INC     R0
01E5 EFE1       587         DJNZ    R7,SHRB
01E7 C8         588         DEC     R0
01E8 C9         589         DEC     R0
01E9 C8         590         DEC     R0
01EA E9DE       591         DJNZ    R1,SHRA  ; ALL BITS DONE?
01EC 83         592         RET              ; YES.
                593 ;;;;;;;;;;;;;;;;
0310            594         ORG     310H
                595 ;;;;;;;;;;;;;;;;;;;;;;;;
0310 B83D       596 TSTSC:  MOV     R0,#SUB
0312 B937       597         MOV     R1,#SUBC
0314 BF03       598 ROTOR1: MOV     R7,#3
0316 F0         599 TSTSCA: MOV     A,@R0
0317 A1         600         MOV     @R1,A
0318 C8         601         DEC     R0
0319 C9         602         DEC     R1

LOC  OBJ        SEQ         SOURCE STATEMENT

031A EF16       603         DJNZ    R7,TSTSCA
031C 83         604         RET
                605 ;;;;;;;;;;;;;;;;;;;;;;;;;;;;;;
                606 ; CR:
```

```
                607 ; COMPUTE RATE ROUTINE.
                608 ; MIN=CONSTANT, SUB=N, MIN - SUB --> MIN.
                609 ; CR16 = (12,000,000 / N), WHERE N IS THE
                610 ; NO. OF INCREMENTS OF 80 US PULSES.
                611 ; FOR 16 INPUT PULSES.
                612 ; CR4 = 3,000000/N
                613 ; CR1 = 750000/N.
                614 ; R6 = QCTR ,QUOTIENT COUNTER.
                615 ; R5 = QDGT , VALUE OF QUOTIENT DIGIT
                616 ; R3 = TZCTR ,CURRENT TRAIL ZEROES COUNTER.
                617 ; R2 = QPTR ,QUOTIENT POINTER WHERE QDGT IS TO BE STORED.
                618 ;;;;;;;;;;;;;;;;;;;;;;;
031D A5         619 CR:     CLR     F1              ; RESET QNZFLAG.
031E BE05       620         MOV     R6,#5H          ; INIT QCTR.
0320 BB06       621         MOV     R3,#6H          ; INIT TZCTR = 6.
0322 BA29       622         MOV     R2,#29H         ; INIT QPTR TO MSSD OF QUOT.
0324 27         623         CLR     A
0325 AD         624         MOV     R5,A            ; CLR QDGT.
0326 B82B       625         MOV     R0,#RATLSD      ; CLR QUO REG.
0328 34C1       626         CALL    CLREG
                627 ;;;;;;;;;;;;;;;;;;;;;;;;;;;;;;
032A B839       628         MOV     R0,#MIN-1       ; MIN=75?
032C F0         629         MOV     A,@R0
032D D375       630         XRL     A,#75H
032F 9633       631         JNZ     DSUB20
0331 BB02       632         MOV     R3,#02H         ; YES,2-->R3.
0333 5497       633 DSUB20: CALL    RDSW            ; NO,R3=6,, READ DPSW.
0335 B82F       634         MOV     R0,#DPPTR
0337 F0         635         MOV     A,@R0
0338 37         636         CPL     A               ; R3 +(4-DPSW)-->R3 TZCTR.
0339 0305       637         ADD     A,#05H
033B 6B         638         ADD     A,R3
033C AB         639         MOV     R3,A
                640 ;;;;;;;;;;;;;;;;;;;;;;;;;
033D 7410       641 TZINZ:  CALL    TSTSC           ; TRANSFER SUB TO SUBC.
033F B837       642         MOV     R0,#SUBC        ; COMPUTE 9'S COMP OF SUBC.
0341 3488       643         CALL    NC
                644 ;
                645 ;
0343 B837       646 DSUB.   MOV     R0,#SUBC        ; BCD SUBTRACT OF
0345 34B1       647         CALL    ADMIN           ; MIN - SUBC --> MIN.
0347 E64F       648         JNC     DSUB2           ; BAD O/F,
                649 ;
                650 ; C= 1, GOOD, MIN GE SUBC, INCR QUOTIENT DGT.
0349 764C       651         JF1     DSUB1           ; QNZ FL? QUO NOT ZERO FL.
034B B5         652         CPL     F1              ; NOT SET, SET IT.
034C 1D         653 DSUB1:  INC     R5              ; INCR QDGT.
034D 6443       654         JMP     DSUB            ; CONT SUBTRACT.
                655 ;
034F B83D       656 DSUB2:  MOV     R0,#SUB         ; C = 0,O/F, MIN LT SUBC,
0351 34B1       657         CALL    ADMIN           ; RETRIEVE OLD MIN.

LOC OBJ         SEQ     SOURCE STATEMENT

658 ;                               ; REM + SUB --> MIN.
0353 FD         659         MOV     A,R5            ; QDGT = 0?
0354 965A       660         JNZ     DSUB3           ; NO,SAVE IT.
                661 ;
```

| | | | | | |
|---|---|---|---|---|---|
| 0356 765A | 662 | | JF1 | DSUB3 | ; YES, QNZFL SET, STORE QDGT. |
| 0358 6463 | 663 | | JMP | DSUB4 | ; QNZF NS, IGNORE QDGT, DIVIDE AGAIN. |
| | 664 | ; | | | |
| 035A B82B | 665 | DSUB3: MOV | R0,#RATLSD | | ;SHIFT RATE LFT 1 DIG. |
| 035C 34A0 | 666 | | CALL | SHLFT | |
| 035E 27 | 667 | | CLR | A | ; STORE QDGT AT LSD |
| 035F 2D | 668 | | XCH | A,R5 | ; AND CLR IT. |
| 0360 40 | 669 | | ORL | A,@R0 | |
| 0361 A0 | 670 | | MOV | @R0,A | |
| 0362 CE | 671 | | DEC | R6 | ; DECR QCTR. |
| | 672 | ;;;;;;;;;;;;;;;;;;;;;;;;;;;;;;;;; | | | |
| | 673 | ; SHIFT MINUEND AND DIVIDE AGAIN UNTIL | | | |
| | 674 | ; 6 DIGITS ARE OBTAINED. | | | |
| | 675 | ; | | | |
| 0363 FB | 676 | DSUB4: MOV | A,R3 | | ; R3 (TZCTR)=0? |
| 0364 9674 | 677 | | JNZ | DSUB12 | |
| 0366 647E | 678 | | JMP | DSUB11 | |
| | 679 | ; | MOV | R3,#0FFH | ; YES,FF-->R3,FOR RNDUP FL. |
| 0368 6478 | 680 | | JMP | DSUB7 | |
| 036A 0301 | 681 | DSUB10: ADD | A,#01H | | ;NO, R3 (TZCTR)=FF? |
| 036C 9674 | 682 | | JNZ | DSUB12 | |
| 036E BD04 | 683 | | MOV | R5,#04H | ; YES, 4-->DPCTR FOR MULT. |
| 0370 B82B | 684 | | MOV | R0,#RATLSD | ; YES, ROUND UP RATE. |
| 0372 24C9 | 685 | | JMP | RNDUP | |
| 0374 FE | 686 | DSUB12: MOV | A,R6 | | ;NO, QCTR =0? |
| 0375 C67E | 687 | | JZ | DSUB11 | |
| 0377 CB | 688 | | DEC | R3 | ; NO,DEC TZCTR. |
| 0378 B83A | 689 | DSUB7: MOV | R0,#MIN | | ;SHIFT MIN, DO AGAIN. |
| 037A 34A0 | 690 | | CALL | SHLFT | |
| 037C 6443 | 691 | | JMP | DSUB | |
| 037E BD04 | 692 | DSUB11 MOV | R5,#04H | | ; FUTURE. |
| 0380 FB | 693 | | MOV | A,R3 | ; R3=0? |
| 0381 C6A4 | 694 | | JZ | DSUB14 | ; Y, 4->R5. |
| 0383 BC00 | 695 | | MOV | R4,#0H | ;NO,COMP LZ IN XER. |
| 0385 B830 | 696 | | MOV | R0,#XERMSD | ; IN R4. |
| 0387 FC | 697 | LZX: MOV | A,R4 | | ; LN? |
| 0388 128E | 698 | | JB0 | LZX1 | ;Y. |
| 038A F0 | 699 | | MOV | A,@R0 | ;NO, HN? |
| 038B 47 | 700 | | SWAP | A | |
| 038C 6490 | 701 | | JMP | LZX2 | ; ADJ LZCTR. |
| 038E F0 | 702 | LZX1: MOV | A,@R0 | | ;LN, INC LZPTR. |
| 038F 18 | 703 | | INC | R0 | |
| 0390 530F | 704 | LZX2: ANL | A,#0FH | | ; NIB=0? |
| 0392 9697 | 705 | | JNZ | LZX3 | ;NO, OVER. |
| 0394 1C | 706 | | INC | R4 | ;Y, INC LZCTR. |
| 0395 6487 | 707 | | JMP | LZX | ;NO, DO AGAIN. |
| 0397 FB | 708 | LZX3 MOV | A,R3 | | ;R3 GT LZCTR+1? |
| 0398 37 | 709 | | CPL | A | |
| 0399 0301 | 710 | | ADD | A,#01H | |
| 039B AD | 711 | | MOV | R5,A | ;TEMP SAVE. |
| 039C 6C | 712 | | ADD | A,R4 | |

LOC  OBJ        SEQ       SOURCE STATEMENT

| | | | | | |
|---|---|---|---|---|---|
| 039D 17 | 713 | | INC | A | |
| 039E F2A5 | 714 | | JB7 | DSUB13 | ;YES,ERR. |
| 03A0 FD | 715 | | MOV | A,R5 | ; NO, (4-R3)->R5. |

```
03A1 0304      716        ADD      A,#04H
03A3 AD        717 DSUB15: MOV      R5,A
03A4 83        718 DSUB14: RET
03A5 448D      719 DSUB13: JMP      ERROR
               720 ;;;;;;;;;;;;;;;;;;;;;;;;;;;;;;;;;;;;;
               721 ; DSPLAY ROUTINE.
               722 ; MSD = HI NIB OF 28
               723 ; LSD = LO NIB OF 26.
               724 ; MSD IS DISPLAYED FIRST
               725 ;;;;;;;;;;;;;;;;;;;;
03A7 D5        726 DSPLAY: SEL     RB1
03A8 145F      727        CALL     TPOLL
03AA BA06      728        MOV      R2,#06H ; DIGIT COUNTER.
03AC BB20      729        MOV      R3,#20H ; STROBE MASK. FOR MSD (D6).
               730 ;
03AE 85        731        CLR      F0      ; SET F0 (ZS FLAG).
03AF 95        732        CPL      F0
               733 ;
03B0 FB        734 LOOP:  MOV      A,R3    ; CHK NIBBLE.
03B1 B826      735        MOV      R0,#26H ; FOR DIGS 6,5.
03B3 B2C2      736        JB5      HINIB
03B5 92BF      737        JB4      LOWNIB
03B7 18        738        INC      R0      ;FOR DIGS 4,3.
03B8 72C2      739        JB3      HINIB
03BA 52BF      740        JB2      LOWNIB
03BC 18        741        INC      R0      ;FOR DIGS 2,1.
03BD 32C2      742        JB1      HINIB
03BF F0        743 LOWNIB MOV      A,@R0   ; GET DIG VALUE.
03C0 64C4      744        JMP      LB1
03C2 F0        745 HINIB  MOV      A,@R0
03C3 47        746        SWAP     A
03C4 530F      747 LB1:   ANL      A,#0FH  ; MASK OFF UNWANTED.
               748 ;
03C6 96D4      749 ZS:    JNZ      ZS1     ; DIG = 0?
03C8 B6CC      750        JF0      ZS2     ; YES, ZS FLAG?
03CA 64D5      751        JMP      ZS3     ; NO, DISPLAY ZERO.
03CC FA        752 ZS2:   MOV      A,R2    ; SET, DISPLAY BLANK.
03CD 07        753        DEC      A
03CE C6D5      754        JZ       ZS3
03D0 FB        755        MOV      A,R3
03D1 00        756        NOP
03D2 64DD      757        JMP      ZS4
03D4 85        758 ZS1:   CLR      F0      ; DIG NE 0, RES ZSFL.
03D5 00        759 ZS3:   NOP
03D6 02        760        OUTL     BUS,A   ; OUTPUT IT.
               761 ;
03D7 B805      762        MOV      R0,#05H
03D9 E8D9      763 DELAY1 DJNZ     R0,DELAY1 ; SEG TO DIG DELAY.
               764 ;
03DB FB        765        MOV      A,R3
03DC 39        766        OUTL     P1,A    ; OUTPUT STROBE.
               767 ;

LOC  OBJ       SEQ        SOURCE STATEMENT

03DD 77        768 ZS4:   RR       A       ; INCR STROBE BY SHIFT.
03DE 2B        769        XCH      A,R3
               770 ;
```

```
03DF B810        771          MOV    R0,#10H  ; DELAY CONSTANT.
03E1 E8E1        772 DELAY:   DJNZ   R0,DELAY ; DELAY OVER?
03E3 2380        773          MOV    A,#80H   ; YES, RESET AL STROBES FOR GHOSTING.
03E5 39          774          OUTL   P1,A     ; RES DP SW STROBE.
                 775 ;
03E6 EAB0        776          DJNZ   R2,LOOP  ; ALL DIGITS DONE?
03E8 C5          777 RDS:     SEL    RB0
03E9 83          778          RET             ; YES, RETURN.
                 779 ;
                 780 ;;;;;;;;;;;;;;;;;;;;;;;;;;;;;;;
                 781 ; PAGE 3 DEFINITION.
0300             782          ORG    300H
                 783 ; 16 LOCATIONS RESERVED.
0300 20          784 ZERO:    DB     20H
0301 AE          785 ONE:     DB     0AEH
0302 90          786 TWO:     DB     90H
0303 88          787 THREE:   DB     88H
0304 0E          788 FOUR:    DB     0EH
0305 48          789 FIVE:    DB     48H
0306 40          790 SIX:     DB     40H
0307 AC          791 SEVEN:   DB     0ACH
0308 00          792 EIGHT:   DB     00H
0309 08          793 NINE:    DB     08H
030A 04          794 CHARA:   DB     04H
030B 42          795 CHARB:   DB     42H
030C D2          796 CHARC:   DB     0D2H
030D 82          797 CHARD:   DB     82H
030E 50          798 CHARE:   DB     50H
030F FF          799 BLANK:   DB     0FFH
                 800 ;;;;;;;;;;;;;;;;;;;;;;;;;;;;;;;
                 801 ; LOAD DPCTR IN CR ROUTINE.
                 802 ;    FACTOR = .9999 INCORPORATED.
                 803 ; MULT:
                 804 ; HTIS ROUTINE MULTIPLIES RATE WITH
                 805 ; A 4 DIGIT MULTIPLIER, ALL IN BCD.
                 806 ; ERROR IS FLAGGED BY DISPLAYING 999999 IF THE
                 807 ; PRODUCT EXEEDS 6 DGITS.
                 808 ;;;;;;;;;;;;;;;;;;;;;;;;;;;;;;;
                 809 ; REGISTER ASSIGNMENT:
                 810 ; XAND (MULTIPLICAND REG) = SUB (3B-3D LSD)
                 811 ; XER  (MULTIPLIER REG)   = (30-31 LSD)
                 812 ; PROD (PRODUCT REG)      = MIN (38-3A LSD)
                 813 ; WORKING REG = SUBC (35-37 LSD)
                 814 ;
                 815 ; R2 = WORKING SHIFT REG.
                 816 ; R3 = XER CTR / PTR (MULTIPLIER CTR/PTR)
                 817 ; R4 = SR (SHIFT REG CTR)
                 818 ; R5 = DPCTR
                 819 ; R6 = XERDIG (MULTIPLIER DIGIT)
                 820 ;;;;;;;;;;;;;;;
0200             821          ORG    200H
                 822 ; DFADJ: IF DPCTR NE 0, DECR DPCTR.

LOC  OBJ         SEQ          SOURCE STATEMENT

823 ; ROUND UP PROD. AND XAND REG, SET INH SR INC FLAG.
                 824 ; ELSE, ERROR.
```

```
0200 FD        825 OFADJ:  MOV   A,R5      ; DPCTR=0?
0201 C68D      826         JZ    ERROR     ; YES, ERROR.
0203 CD        827         DEC   R5        ; NO, DECR DPCTR.
0204 B83A      828         MOV   R0,#MIN   ; ROUND UP PROD.
0206 34C9      829         CALL  RNDUP
0208 B837      830         MOV   R0,#SUBC           ; ROUND UP XAND.
020A 34C9      831         CALL  RNDUP
020C FC        832         MOV   A,R4      ; SR = 0?
020D C613      833         JZ    OFADJ2
020F 03FC      834         ADD   A,#0FCH   ; NO, (SR-4)-->SR.
0211 AC        835         MOV   R4,A
0212 83        836         RET
0213 2304      837 OFADJ2: MOV   A,#04H    ; YES, SET NS (NO SHIFT) FL.
0215 04F1      838         JMP   SETFL1
               839 ;;;;;;;;;;;;;;;;;;;;;;;;;;;;;;;;;
               840 ; INITIALIZE REGISTERS.
0217 27        841 MULT:   CLR   A
0218 AB        842         MOV   R3,A      ; ZERO XER CTR/PTR.
0219 AC        843         MOV   R4,A      ; ZERO SR CTR.
               844 ;
021A B83A      845         MOV   R0,#MIN   ; CLEAR PRODUCT.
021C 34C1      846         CALL  CLREG
               847 ;
021E 23FB      848         MOV   A,#0FBH   ; RES NS FLAG.
0220 14F6      849         CALL  RESFL1
               850 ;
0222 B830      851 MULT1:  MOV   R0,#XER-1 ; NO, R0 --> XERMSD.
0224 FB        852         MOV   A,R3      ; XERPTR-->MSD?
0225 3228      853         JB1   MULT1A
0227 18        854         INC   R0        ; NO, R0-->XERLSD
0228 122D      855 MULT1A: JB0   MHN       ; YES, HI NIBBLE?
022A F0        856 MLN:    MOV   A,@R0     ; NO, LSD.
022B 442F      857         JMP   MLNA
               858 ;
022D F0        859 MHN:    MOV   A,@R0     ; NO, MSD?
022E 47        860         SWAP  A
022F 530F      861 MLNA:   ANL   A,#0FH    ; MASK OFF HI NIB.
               862 ;
0231 AE        863         MOV   R6,A      ; SAVE XER DIG IN R6
0232 963A      864         JNZ   MULT2     ; XER = 0?
               865 ;
0234 B837      866         MOV   R0,#SUBC           ; SET, ZERO XAND.
0236 34C1      867         CALL  CLREG
0238 445B      868         JMP   MULT3
               869 ;
023A B83F      870 MULT2:  MOV   R0,#FLAG1          ; ERR FL?
023C F0        871         MOV   A,@R0
023D 1200      872         JB0   RDMUL2    ; SET, RET.
023F 7410      873         CALL  TSTSC     ; R6 NE 0, XAND-->WORK REG(SUBC).
               874 ;
0241 FC        875 MULT2A: MOV   A,R4      ; SHIF REG = 0?
0242 C65B      876         JZ    MULT3     ; YES, BYPASS SHIFT.
0244 FC        877 MULT2D: MOV   A,R4      ; NO, R4-->R2.

LOC  OBJ       SEQ         SOURCE STATEMENT

0245 AA        878 MULT2B: MOV   R2,A      ; NO, SAVE SR IN WORKING REG.
```

```
0246 C65B      879         JZ      MULT3       ;R2=0?
0248 B837      880         MOV     R0,#SUBC    ; NO, SHIFT XAND.
024A 34A0      881         CALL    SHLFT       ; SHIFT LEFT 4.
024C B835      882         MOV     R0,#SUBCMS  ; O/F? MSD HI NIB NE 0?
024E 53F0      883         ANL     A,#0F0H
0250 C656      884         JZ      MULT2C
0252 5400      885         CALL    OFADJ       ; YES, CORRECT IT.
0254 443A      886         JMP     MULT2
0256 FA        887 MULT2C: MOV     A,R2        ; NO, OK, DECR R2 BY 4.
0257 03FC      888         ADD     A,#0FCH
0259 4445      889         JMP     MULT2B      ; NO, CONTINUE SHIFT.
025B B837      890 MULT3:  MOV     R0,#SUBC    ; PROD + XAND-->PROD.
025D 34B1      891         CALL    ADMIN
025F B838      892         MOV     R0,#MINMSD  ; R0-->MSD.
0261 F0        893         MOV     A,@R0       ; PROD TOO BIG? (O/FO?)
0262 53F0      894         ANL     A,#0F0H
0264 C668      895         JZ      MULT10      ; NO, OK.
0266 5400      896         CALL    OFADJ       ; YES, O/F ADJUST, ERR CHK.
0268 FE        897 MULT10: MOV     A,R6        ; XER DIG =0?
0269 C66F      898         JZ      MUL10C
026B CE        899         DEC     R6          ; NO, DECR XERD DIG.
026C 07        900         DEC     A           ; R6= 0?
026D 965B      901         JNZ     MULT3       ; NO, AD AGAIN.
026F B83F      902 MUL10C: MOV     R0,#FLAG1   ; YES, NS FLAG?
0271 F0        903         MOV     A,@R0
0272 527A      904         JB2     MUL10B
0274 1C        905         INC     R4          ; NOT SET, INC SR.
0275 1C        906         INC     R4
0276 1C        907         INC     R4
0277 1C        908         INC     R4
0278 447E      909         JMP     MUL10A
027A 23FB      910 MUL10B: MOV     A,#0FBH     ; SET, RES IT.
027C 14F6      911         CALL    RESFL1
027E 1B        912 MUL10A: INC     R3          ; INC R3 XERCTR.
027F FB        913         MOV     A,R3        ; DONE 4 DIGITS?
0280 03FC      914         ADD     A,#0FCH
0282 F686      915         JC      MUL21A
0284 4422      916         JMP     MULT1       ; NO, DO NEXT DIGIT.
               917 ;
0286 FD        918 MUL21A: MOV     A,R5        ; YES, DPPTR=0?
0287 C691      919         JZ      MULTZ       ; YES.
0289 5400      920         CALL    OFADJ       ; TRUNCATE DEC DIGITS.
028B 4486      921         JMP     MUL21A      ; DO AGAIN.
               922 ;;;;;;;;;;;;;;;;;;;;;;;;;
028D 2301      923 ERROR:  MOV     A,#01H      ;SET ERR FL.
028F 04F1      924         JMP     SETFL1
               925 ;;;;;;;;
0291 B83A      926 MULTZ:  MOV     R0,#MIN     ;TRANSFER PROD TO RATE.
0293 B92B      927         MOV     R1,#RATLSD
0295 6414      928         JMP     ROTOR1
               929 ;;;;;;;;;;;;;;;;;;;;;;;;;;;
               930 ; READ SWITCHES AND DP #.
               931 ; STROBE BY OUTPUTTING COMPL ON P20 TO P23
               932 ; P20=MSD  GET READING ON P24 TO P27 (MSB).
```

| LOC OBJ | SEQ | | SOURCE STATEMENT | |
|---|---|---|---|---|
| | 933 | ;;;;;;;;;;;;;;;;;;;;;;;;;;;;;;;;;; | | |
| 0297 8AFF | 934 RDSW: | ORL | P2,#0FFH | ;PROGRAM AS INPUT. |
| 0299 997F | 935 | ANL | P1,#07FH | ;READ DEC POINT. |
| 029B 0A | 936 | IN | A,P2 | |
| 029C 37 | 937 | CPL | A | |
| 029D 53F0 | 938 | ANL | A,#0F0H | |
| 029F 47 | 939 | SWAP | A | |
| 02A0 B82F | 940 | MOV | R0,#DPPTR | |
| 02A2 A0 | 941 | MOV | @R0,A | |
| 02A3 03FB | 942 | ADD | A,#0FBH ; DP GT 4? | |
| 02A5 E6A9 | 943 | JNC | RDSW1 ;NO,OK. | |
| 02A7 B004 | 944 | MOV | @R0,#04H | ;YES,FORCE DP=4. |
| 02A9 8980 | 945 RDSW1: | ORL | P1,#80H ;CLEAR DP STROBE. | |
| 02AB B831 | 946 RDMUL: | MOV | R0,#31H ;RES MULTIPLIER. | |
| 02AD 27 | 947 | CLR | A | |
| 02AE A0 | 948 | MOV | @R0,A | |
| 02AF C8 | 949 | DEC | R0 | |
| 02B0 A0 | 950 | MOV | @R0,A | |
| 02B1 17 | 951 | INC | A | |
| 02B2 A9 | 952 RDMUL1: | MOV | R1,A | ;STROBE MULT SW. |
| 02B3 37 | 953 | CPL | A | |
| 02B4 3A | 954 | OUTL | P2,A | |
| 02B5 0A | 955 | IN | A,P2 | |
| 02B6 37 | 956 | CPL | A | |
| 02B7 53F0 | 957 | ANL | A,#0F0H | |
| 02B9 B830 | 958 | MOV | R0,#30H | |
| 02BB 29 | 959 | XCH | A,R1 | ;HI NIB? |
| 02BC 12C7 | 960 | JB0 | RDHI | ;YES. |
| 02BE 32C3 | 961 | JB1 | RDLOW | ;NO. |
| 02C0 18 | 962 | INC | R0 | |
| 02C1 52C7 | 963 | JB2 | RDHI | |
| 02C3 29 | 964 RDLOW: | XCH | A,R1 | |
| 02C4 47 | 965 | SWAP | A | |
| 02C5 44C8 | 966 | JMP | RDHI1 | |
| 02C7 29 | 967 RDHI: | XCH | A,R1 | |
| 02C8 40 | 968 RDHI1: | ORL | A,@R0 | |
| 02C9 A0 | 969 | MOV | @R0,A | |
| 02CA F9 | 970 | MOV | A,R1 | |
| 02CB E7 | 971 | RL | A | |
| 02CC 92D0 | 972 | JB4 | RDMUL2 ; DONE? | |
| 02CE 44B2 | 973 | JMP | RDMUL1 ;NO. | |
| 02D0 83 | 974 RDMUL2 | RET | | ;YES. |
| | 975 | ;;;;;;;;;;;;;;;;;;;;;;;;;;;;;;;;;; | | |
| | 976 ; PATCH 0 | | | |
| | 977 | ;;;;;;;;;;;;;;;;;;;;;;;;;;;;;;;;;; | | |
| 02D1 E6D4 | 978 TP0: | JNC | INT21 | ;O/F DUE TO ADD ABOVE? |
| 02D3 1D | 979 | INC | R5 | ;YES,INCR R5. |
| 02D4 16D8 | 980 INT21: | JTF | INT22 | ;NO,O/F DUE TO T? |
| 02D6 44D9 | 981 | JMP | INT23 | ;NO,OK,PROCEED. |
| 02D8 1D | 982 INT22: | INC | R5 | ;YES,INCR R5. |
| 02D9 97 | 983 INT23: | CLR | C | |
| 02DA FD | 984 | MOV | A,R5 | ;R5 GT A6H (CALC LIMIT?) |
| 02DB 0358 | 985 | ADD | A,#58H | |
| 02DD F6E1 | 986 | JC | TP1 | ;YES,FORCE RATE=0. |
| 02DF 04DC | 987 | JMP | INT5 | ;NO,OK. |

```
LOC  OBJ      SEQ       SOURCE STATEMENT

02E1 2380     988 TP1    MOV   A,#80H  ;SET T10SECF TO DISPLAY RATE=0
02E3 04E6     989        JMP   INT7
              990 END
```

USER SYMBOLS

| | | | | | | | | | | | | | |
|---|---|---|---|---|---|---|---|---|---|---|---|---|---|
| ADMIN | 01B1 | ADMINA | 01B8 | BLANK | 030F | BTDR | 0137 | BTDR1 | 0150 | BTDR2 | 0158 | BTDR3 | 015E | BTDR4 | 0166 |
| BTDR5 | 016D | BTDR6 | 0174 | BTDR7 | 017B | BTDR8 | 0180 | CHARA | 030A | CHARB | 030B | CHARC | 030C | CHARD | 030D |
| CHARE | 030E | CLRAM | 0010 | CLREG | 01C1 | CLREG1 | 01C3 | CR | 031D | DELAY | 03E1 | DELAY1 | 03D9 | DISP | 0028 |
| DPPTR | 002F | DSPLAY | 03A7 | DSUB | 0343 | DSUB1 | 034C | DSUB10 | 036A | DSUB11 | 037E | DSUB12 | 0374 | DSUB13 | 03A5 |
| DSUB14 | 03A4 | DSUB15 | 03A3 | DSUB2 | 034F | DSUB20 | 0333 | DSUB3 | 035A | DSUB4 | 0363 | DSUB7 | 0378 | EIGHT | 0308 |
| ERROR | 028D | EX | 0022 | EX0 | 0024 | EX1 | 0048 | EX1A | 005B | EX2 | 0031 | EX3 | 002D | EX4 | 003F |
| EX5 | 0041 | EX6 | 002B | FIVE | 0305 | FLAG1 | 003F | FOUR | 0304 | HINIB | 03C2 | INT | 0081 | INT1 | 00A0 |
| INT16A | 00CD | INT16B | 00CA | INT16P | 00C8 | INT1F | 00E7 | INT2 | 00D0 | INT21 | 02D4 | INT22 | 02D8 | INT23 | 02D9 |
| INT4P | 00BE | INT5 | 00DC | INT6 | 00E1 | INT7 | 00E6 | INTV | 0003 | LB1 | 03C4 | LOOP | 03B0 | LOWNIB | 03BF |
| LZX | 0387 | LZX1 | 038E | LZX2 | 0390 | LZX3 | 0397 | MHN | 022D | MIN | 003A | MINMSD | 0038 | MLN | 022A |
| MLNA | 022F | MUL10A | 027E | MUL10B | 027A | MUL10C | 025F | MUL21A | 0286 | MULT | 0217 | MULT1 | 0222 | MULT10 | 0268 |
| MULT1A | 0228 | MULT2 | 023A | MULT2A | 0241 | MULT2B | 0245 | MULT2C | 0256 | MULT2D | 0244 | MULT3 | 025B | MULTZ | 0291 |
| NC | 0188 | NCA | 018A | NEXT | 0096 | NINE | 0309 | OFADJ | 0200 | OFADJ2 | 0213 | OFRLST | 002C | ONE | 0301 |
| OTLAST | 002E | ROTOR1 | 0314 | RATLSD | 002B | RATMSD | 0029 | RDHI | 02C7 | RDHI1 | 02C8 | RDLOW | 02C3 | RDMUL | 02AB |
| RDMUL1 | 02B2 | RDMUL2 | 02D0 | RDS | 02E8 | RDSW | 0297 | RDSW1 | 02A9 | RESFL1 | 00F6 | RINT | 00EC | RNDUP | 01C9 |
| RNDUPA | 01CE | RTPOLL | 007E | SEC | 0115 | SETFL1 | 00F1 | SEVEN | 0307 | SHLA | 01A2 | SHLB | 01A5 | SHLFT | 01A0 |
| SHRA | 01DE | SHRB | 01E1 | SHRYT | 01DC | SIX | 0306 | START | 0008 | STARTV | 0000 | STDEC | 011F | STDEC1 | 0124 |
| STDEC4 | 0125 | STDEC5 | 012C | STDEC6 | 0132 | SUB | 003D | SUBC | 0037 | SUBCMS | 0035 | SUBR | 0100 | T10SR | 0022 |
| T1SECR | 0023 | THREE | 0303 | TINT1 | 0063 | TINT2 | 007A | TINT3 | 007F | TINT4 | 0070 | TINTV | 0007 | TLAST | 0033 |
| TP0 | 02D1 | TP1 | 02E1 | TPOLL | 005F | TREG | 002D | TSTSC | 0310 | TSTSCA | 0316 | TWO | 0302 | TZINZ | 033D |
| UPDEC | 0117 | X12W56 | 0118 | XER | 0021 | XERMSD | 0030 | ZERO | 0300 | Z5 | 03C6 | ZS1 | 03D4 | ZS2 | 03CC |
| ZS3 | 03D5 | ZS4 | 03D0 | | | | | | | | | | |

ASSEMBLY COMPLETE, NO ERRORS

We claim:

1. In a multirange rate monitor apparatus for receiving event signals generated by a source of event signals and for determining the rate at which the event signals are being generated, an automatic ranging arrangement comprising:

pulse generating means responsive to the event signals for generating pulses at a rate corresponding to the frequency of the event signals;

pulse accumulating means for accumulating the pulses;

interval timing means for generating timing signals defining elapsed time intervals;

means responsive to the first pulse of a series of pulses generated by said pulse generating means for clearing said pulse accumulating means and for starting said interval timing means whereby the elapsed time intervals are measured from the time of occurrence of said first pulse;

data storage means for storing timing data signals representing preselected elapsed time intervals of different durations;

and range select means including means responsive to said pulse accumulating means accumulating a predetermined number of pulses for comparing the timing signals generated by said interval timing means with the timing data signals stored by said data storage means, and selecting means for selecting a first number of pulses indicative of a first range of operation for said rate monitor apparatus for use in determining the rate of the event signals if said predetermined number of pulses has been accumulated during a first interval of elapsed time measured from the time of occurrence of said first pulse and for selecting a second number of pulses indicative of a second range of operation of said rate monitor apparatus for use in determining the rate of the event signals if said predetermined number of pulses has been accumulated before the end of a second elapsed time interval following said first elapsed time interval, and in the event that said predetermined number of pulses fails to be accumulated by the end of said second interval of elapsed time, said selecting means selecting a third number of pulses indicative of a third range of operation of said rate monitor apparatus for use in determining the rate of the event signals.

2. The rate monitor apparatus of claim 1 wherein said range select means responds to a change in the rate of the event signals to effect a corresponding change in the operation range of the rate monitor apparatus, the change in operation range being effected in response to the first series of pulses generated in response to event signals at the changed rate.

3. The rate monitor apparatus of claim 1 further comprising display means for displaying data; factor switch means; and means for sensing the state of said factor switch means and for causing data to be displayed to be multiplied by a factor indicated by the setting of the factor switch means.

4. The rate monitor apparatus of claim 3 wherein said factor switch means comprises a plurality of switches each individually settable to a plurality of different positions to enable said factor switch means to provide a plurality of different factors.

5. The rate monitor of claim 1 which comprises display means for displaying data, and further timing means for defining a reset timing interval of a given duration, and means for causing said display means to display a zero reading whenever a pulse fails to be generated by said pulse generating means during a reset timing interval.

6. The rate monitor apparatus of claim 1 which includes display means for displaying data, and means for causing said display means to provide a floating-decimal multi-digit numerical display of data.

7. In a multirange rate monitor apparatus for receiving event signals generated by a source of event signals and for determining the rate at which the event signals are being generated, an automatic ranging arrangement comprising:

pulse generating means responsive to the event signals for generating pulses at a rate corresponding to the frequency of the event signals;

pulse accumulating means for accumulating the pulses;

interval timing means for generating timing signals;

means responsive to the first pulse of a series of pulses generated by said pulse generating means for clearing said pulse accumulating means and for starting said interval timing means whereby the timing signals generated represent elapsed time measured from the time of occurrence of said first pulse;

data storage means storing further timing signals which represent a boundary time of a preselected value corresponding to the end of an elapsed time interval measured from the starting of said interval timing means;

and range select means including comparing means responsive to said pulse accumulating means accumulating a first predetermined number of pulses for comparing the timing signals generated by said interval timing means with said timing signals stored in said signal storage means and, if the comparison indicates that the first number of pulses has been accumulated before the boundary time, said comparing means enabling said pulse accumulating means to continue to accumulate pulses until a second predetermined number of pulses has been accumulated, and selecting means responsive to said comparing means for selecting the first number of pulses for use in calculating the rate of the event signals, indicative of a first range of operation for the range monitoring apparatus, if the elapsed time exceeds the boundary time when said first number of pulses is accumulated, and for selecting the second number of pulses for use in calculating the rate of the event signals, indicative of a second range of operation for the rate monitor apparatus, if the first number of pulses was accumulated before the boundary time.

8. The rate monitor apparatus according to claim 7 which has a third range of operation, and wherein said comparing means is responsive to said pulse accumulating means accumulating said second predetermined number of pulses for comparing the timing signals generated by said interval timing means with timing signals representative of a further boundary time and, if the comparison indicates that the second number of pulses has been accumulated before the further boundary time, said comparing means enabling said pulse accumulating means to continue to accumulate pulses until a third predetermined number of pulses has been accumulated, and said selecting means selecting said third predetermined number of pulses for use in calculating the rate of the event signals when the second number of pulses is accumulated before the further boundary time.

9. In a multirange rate monitor apparatus for receiving event signals generated by a source of event signals and for determining the rate at which the event signals are being generated, a method for automatically selecting a range of operation for the apparatus comprising:

generating by way of a pulse generating means pulses at a rate corresponding to the frequency of the event signals;

accumulating the pulses in a pulse accumulating means;

generating timing signals by way of an interval timing means;

resetting said pulse accumulating means and starting said interval timing means to initiate a range selection cycle in response to the first pulse of a series of pulses generated by said pulse generating means;

storing in a signal storage means further timing signals which represent a boundary time of a preselected value corresponding to the end of an elapsed time interval measured from the start of a range selection cycle; and when said pulse accumulating means has accumulated a first preselected number of pulses, comparing timing signals generated by said interval timing means with said timing signals stored in said signal storage means, and if the comparison indicates that the first number of pulses has been accumulated before the boundary time, continuing to accumulate pulses in the pulse accumulating means until a second predetermined number of pulses has been accumulated;

selecting the first number of pulses for use in calculating the rate of the event signals, indicative of a first range of operation for the rate monitor apparatus, if the elapsed time exceeds the boundary time when the first number of pulses has been accumulated, and selecting the second number of pulses for use in calculating the rate of the event signals, indicative of a second range of operation for the rate monitor apparatus, if the first number of pulses is accumulated before the boundary time.

10. The method according to claim 9 wherein determining the range of operation of the rate monitor apparatus includes comparing timing signals generated by said interval timing means with timing signals representative of a further boundary time, enabling the pulse accumulating means to continue to accumulate pulses until a third predetermined number of pulses has been accumulated, and selecting the third predetermined number of pulses for use in calculating the rate of the event signals.

* * * * *